United States Patent [19]
Kaschmitter et al.

[11] Patent Number: 5,346,850
[45] Date of Patent: Sep. 13, 1994

[54] CRYSTALLIZATION AND DOPING OF AMORPHOUS SILICON ON LOW TEMPERATURE PLASTIC

[75] Inventors: James L. Kaschmitter, Pleasanton; Joel B. Truher, Palo Alto; Kurt H. Weiner, Campbell, all of Calif.; Thomas W. Sigmon, Beaverton, Oreg.

[73] Assignee: Regents of the University of California, Oakland, Calif.

[21] Appl. No.: 968,561

[22] Filed: Oct. 29, 1992

[51] Int. Cl.$^5$ .................... C30B 31/20; H01L 21/20
[52] U.S. Cl. ........................... 437/81; 437/83; 437/173; 437/181
[58] Field of Search ............ 148/33, 33.3, DIG. 90, 148/DIG. 93; 156/603; 437/173, 83, 82, 81, 181

[56] References Cited

U.S. PATENT DOCUMENTS

| | | | |
|---|---|---|---|
| 4,059,461 | 11/1977 | Fan et al. | 148/1.5 |
| 4,309,225 | 1/1982 | Fan et al. | 148/1.5 |
| 4,323,417 | 4/1982 | Lam | 148/DIG. 3 |
| 4,400,715 | 8/1983 | Barbee et al. | 357/49 |
| 4,639,277 | 1/1987 | Hawkins | 148/DIG. 54 |
| 4,655,849 | 4/1987 | Schachameyer et al. | 148/DIG. 93 |
| 4,659,401 | 4/1987 | Reif et al. | 437/173 |
| 4,683,144 | 7/1987 | Nishimura et al. | 437/173 |
| 4,719,183 | 1/1988 | Maekawa | 437/19 |
| 4,751,193 | 6/1988 | Myrick | 437/19 |
| 5,055,416 | 10/1991 | Weber | 437/181 |
| 5,122,223 | 6/1992 | Geis et al. | 156/603 |
| 5,207,862 | 5/1993 | Baker et al. | 156/603 |

OTHER PUBLICATIONS

R. Dagani, Flexible Light–Emitting Diode Developed from Conducting Polymers, Chemical & Engineering News, Jun. 29, 1992.

Bean et al "Epitaxial Laser Crystallisation of Thin Film & Amorphous Silicon" Appl. Phys. Lett 33 (1978), 227–230.

*Primary Examiner*—R. Bruce Breneman
*Assistant Examiner*—Ramamohan Rao Paladugu
*Attorney, Agent, or Firm*—L. E. Carnahan; Henry P. Sartorio

[57] ABSTRACT

A method or process of crystallizing and doping amorphous silicon (a-Si) on a low-temperature plastic substrate using a short pulsed high energy source in a selected environment, without heat propagation and build-up in the substrate. The pulsed energy processing of the a-Si in a selected environment, such as BF3 and PF5, will form a doped micro-crystalline or poly-crystalline silicon (pc-Si) region or junction point with improved mobilities, lifetimes and drift and diffusion lengths and with reduced resistivity. The advantage of this method or process is that it provides for high energy materials processing on low cost, low temperature, transparent plastic substrates. Using pulsed laser processing a high (>900° C.), localized processing temperature can be achieved in thin films, with little accompanying temperature rise in the substrate, since substrate temperatures do not exceed 180° C. for more than a few microseconds. This method enables use of plastics incapable of withstanding sustained processing temperatures (higher than 180° C.) but which are much lower cost, have high tolerance to ultraviolet light, have high strength and good transparency, compared to higher temperature plastics such as polyimide.

24 Claims, 2 Drawing Sheets

CRYSTALLIZATION AND DOPING OF AMORPHOUS SILICON ON LOW TEMPERATURE PLASTIC

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to the formation of circuits on a substrate, specifically to circuit formation using pulsed laser processing, and more particularly to a method or process using pulsed laser processing in thin films on low-temperature substrates, with little accompanying temperature rise in the substrate.

Pulsed laser processing (PLP) typically entails applying short ($\sim 35$ ns) pulses of laser energy (0.1–1 J cm$^{-2}$) to silicon or thin films of silicon, in vacuum or a dopant gas atmosphere. Gas-immersion laser doping (GILD) has been extensively developed for use in making shallow, highly doped ($>10^{20}$ cm$^{-3}$) and activated semiconductor junctions. See K. H. Weiner et al., IEEE Electron Device Lett. 13, 369 (1992). Others have used laser processing to achieve low temperature processing for use in making thin film transistors. See K. Sera et al., IEEE Electron Device Lett. 36, 2868 (1989) and R. Z. Bachrach et al., J. Electron. Mater. 19, 241 (1990).

Various prior techniques for improving the crystallinity of semiconductor films by laser energy and doping the films at various depths with various types and concentrations of dopants are exemplified by U.S. Pat. No. 4,059,461 issued Nov. 22, 1977 to J. C. C. Fan et al.; U.S. Pat. No. 4,309,225 issued Jan. 5, 1982 to J. C. C. Fan et al.; U.S. Pat. No. 4,400,715 issued Aug. 23, 1983 to S. G. Barbes et al.; U.S. Pat. No. 4,719,183 issued Jan. 12, 1988 to M. Maekawa; and U.S. Pat. No. 4,751,193 issued Jun. 14, 1988 to J. J. Myrick.

In these prior development and research efforts to improve crystallinity of amorphous material, substrates of silicon or the so-called high temperature plastic or polymeric materials, such as polyimide (e.g. KAPTON, manufactured by Dupont Corp.) have been used, which are capable of withstanding sustained processing temperatures of higher than 180° C. The high temperature plastics are more expensive, have lower resistance to ultraviolet light, lower strength, and less transparency compared to commercial grade, transparent plastics which are incapable of withstanding sustained processing temperatures of higher than 180° C. Thus, there exists in the state of the art a need for a method of producing films mounted on inexpensive low-temperature, commercial grade plastics. The present invention satisfies this need by providing a method or process for crystallization and doping of amorphous silicon on low-temperature plastic using pulsed energy sources.

SUMMARY OF THE INVENTION

It is an object of the present invention to provide a method or process of crystallizing and doping amorphous silicon on a substrate of low-temperature plastic.

It is a further object of the invention to provide a method of improving the crystallinity of amorphous silicon deposited on a substrate not capable of withstanding sustained processing temperatures higher than 180° C.

A further object of the invention is to utilize pulsed laser processing of a thin film of amorphous silicon deposited on a commercial grade transparent plastic.

Another object of the invention is to provide a method or process for crystallizing and doping amorphous silicon deposited on a substrate of low-temperature plastic using pulsed laser processing.

Another object of the invention is to provide a low-temperature plastic substrate having a layer of amorphous silicon with or without a buffer layer between the silicon and the substrate, with selected regions of the amorphous silicon converted to micro-crystalline or polycrystalline silicon in a selected doping atmosphere.

Other objects and advantages of the invention will become apparent from the following description and accompanying drawing.

Basically, the invention involves a method or process of crystallizing and doping amorphous silicon (a-Si) mounted on a commercial-grade transparent plastic substrate using a pulsed high energy source. The short pulse duration allows for the high energy needed to crystallize and dope a-Si in a time period short enough to prevent heat propagation and built-up in the substrate. The low-temperature substrate is composed of a plastic incapable of withstanding sustained processing temperatures of higher than about 180° C., compared to KAPTON which can withstand upon to about 400°–450° C. The actual number depends heavily on the duration of the applied pulse. The pulsed energy processing of the a-Si will form a micro-crystalline or polycrystalline silicon layer or layer segments with improved mobilities, higher lifetimes, longer drift and diffusion lengths, and reduced resistivity, resulting in better devices which can be fabricated inexpensively due to the low cost of the substrate. Dopant regions, junctions, or layer segments can be formed in-situ using a melt-doping process capable of forming shallow junctions. Similarly, hydrogenization or other materials can be incorporated into the material by introducing the appropriate gas into the chamber. Polycrystalline silicon is considered to have a crystal size of $>500$ Å, whereas micro-crystalline silicon has a crystal size of 30–250 Å.

The unique aspects of this invention are that it provides for high energy materials processing on plastic substrate materials which have a low tolerance to high temperatures. The advantage of doing processing on these types of substrates is that thin-film devices can be formed at low temperatures on low cost plastics or other materials which may be transparent or have other desirable characteristics. Since a-Si can be deposited at low temperatures, all processing steps necessary to make such devices can be performed at low temperatures.

More specifically, and in accordance with the present invention by way of example only, a 1 micron thick layer of a-Si was sputtered on a 2 mil thick sample of Polyethersulfone (PES) plastic. The sample was then laser processed in a desired atmosphere using a 308 nm XeCl excimer laser with 1 or more pulses at approximately 30 nsec/pulse and energy density of 150 mJ cm$^{-2}$. The a-Si was crystallized into micro-poly crystalline silicon. PES is tolerant of processing to about 205° C. Similar experiments have been carried out using other low temperature plastics, as described hereinafter. A similar technique has been experimentally tested for doping of a-Si, and for hydrogenated a-Si on PES, using pulsed energy processing on other low-temperature substrates. PES plastic is one of several low cost, low-temperature plastics which may be utilized in the process of this invention.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

Figure 1:
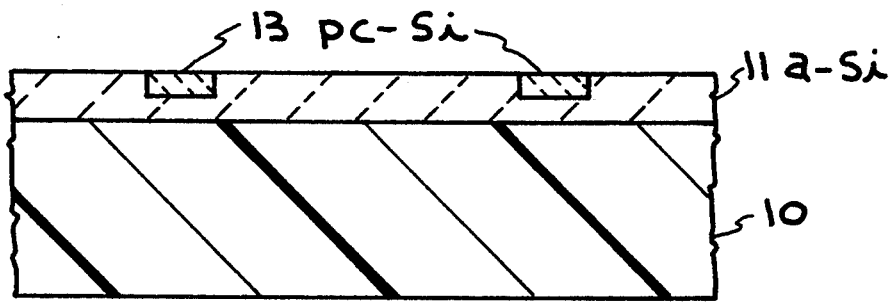
FIG. 1 is a partial cross-sectional view of an embodiment of a structure made in accordance with the present invention.

The present invention is directed to a method or process of crystallizing and doping amorphous silicon on low-temperature plastic using a pulsed high energy source. The invention enables high energy materials processing on plastic substrates which have low tolerance to high temperature and thus enables devices to be formed at low temperatures on low cost plastics. A low-temperature plastic is defined as plastics which are incapable of withstanding sustained processing temperatures of higher than about 180° C. Sustained processing means a time period of longer than about $10^5$ nanoseconds (ns).

In accordance with the present invention, selective synthesis and doping of thin-film polycrystalline and micro-crystalline silicon (pc-Si) from amorphous silicon (a-Si), on a low-temperature polymeric substrate has been carried out. A XeCl excimer laser (308 nm) was used to selectively crystallize and dope areas in the a-Si films, which were sputtered or evaporated at room temperature onto a commercial-grade, transparent plastic which is intolerant of high temperature (>180° C.) processing. The a-Si/plastic substrate samples were exposed to pulsed laser radiation in three different environments, vacuum (<1 mT), 50 torr BF$_3$, and 50 torr PF$_5$, wherein the XeCl laser produced 30 ns (FNHM) pulses of 308 nm light totally approximately one joule per pulse, with the energy density applied to the substrate being modulated by reflecting part of the energy away using beam-splitting optics. Transmission electron microscopy (TEM) and small area diffraction (SAD) were used to measure crystallinity and to confirm the integrity of the processed plastic substrates. Secondary ion mass spectroscopy (SIMS) was used to measure boron and phosphorous dopant profiles and to verify the absence of carbon diffusion from the plastic. The material produced has crystal sizes ranging from a few to hundreds of nanometers, depending upon the processing conditions, and junction depths can be varied from tens to hundreds of nanometers.

A significant advantage of pulsed laser processing (PLP) is that high (>900° C.), localized processing temperatures can be achieved in thin films, with little accompanying temperature rise in the substrate. Pulsed laser processing typically entails applying short, (~35 ns) pulses of laser energy (0.1-1 J cm$^{-2}$) to silicon or thin films of silicon, in vacuum or a dopant gas atmosphere. Gas immersion laser doping (GILD) has been extensively developed for use in making shallow, highly doped (>$10^{20}$ cm$^{-3}$) and activated semiconductor junctions, and laser processing to achieve low temperature processing for use in making thin film transistors has been previously used, as referenced above.

In accordance with the present invention PLP has been applied to crystallize and dope thin films of a-Si which have been deposited on low cost, low-temperature, transparent plastic substrates, as exemplified in FIG. 1 and described in greater detail herein after. Also, the process of this invention has been carried out using a silicon oxide (SiO$_2$) buffer or thermal barrier layer between the substrates and the a-Si, as exemplified in FIG. 2 and described in detail hereinafter. Experiments for verifying the present invention have been conducted on low-temperature plastic substrates of ethylene-chlorotrifluoroethylene (E-CTFE) made under the trademark HALAR by Ausimont U.S.A., Inc., and ethylene-tetra-fluoroethylene (E-TFE) made under the trademark TEFZEL by Dupont Corp. Most formulations of these plastics are incapable of withstanding sustained (~$10^5$ ns) time periods with processing temperatures of higher than about 180° C. See Ausimont U.S.A., Inc., Halar TM data sheet (1990). The results of these experiments verify other recent reported experimental results (see T. Sameshima et al., Jpn. J. Appl. Phys. 28, 1789, 1989) that thermal models which indicate low-temperature substrate temperatures do not exceed 180° C. for more than a few microseconds.

The advantages of using low-temperature plastic, as opposed to higher-temperature plastics such as poly-imide (e.g. Kapton TM), include much lower cost, higher tolerance to ultra-violet light, high strength, and transparency. Another potential advantage to low temperature processing is that it may allow the use of conductive or light emitting plastics as substrates, but this has not yet been experimentally verified. Recent advances in excimer lasers, designed for production use, have also made laser processing potentially cost effective.

To verify the present invention, and to provide a better understanding of thermal effects on processing, two different embodiments have been utilized. As illustrated in FIG. 1, a substrate 10 consisting of 0.13 mm E-CTFE was covered with a layer 11 of 0.5 $\mu$m amorphous silicon (a-Si). As illustrated in FIG. 2, a buffer layer 12 of 0.5 $\mu$m SiO$_2$ has been provided between the E-CTFE substrate 10' and the a-Si layer 11'. The SiO$_2$ layer 12 acts as a temperature-tolerant heat reservoir, allowing a higher energy dose to be applied to the a-Si without significantly increasing the E-CTFE substrate 10' temperature compared to the temperature reached in the substrate 10 of FIG. 1 without the SiO$_2$ buffer layer 12.

Figure 2:
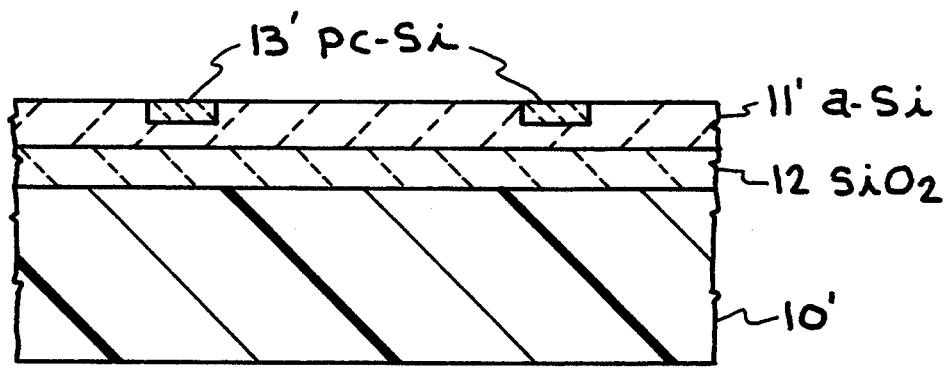
FIG. 2 is a view similar to FIG. 1, but incorporating a buffer layer between the substrate and the amorphous silicon layer.

In fabrication of the FIG. 1 embodiment, for example, the a-Si layer 11 was deposited on the E-CTFE substrate 10 by evaporating pure (99.999%) silicon onto the E-CTFE substrate at room temperature in an electron beam-heated evaporator to the 0.5 $\mu$m thickness. In fabrication of the FIG. 2 embodiment, for example, the 0.5 μm SiO₂ buffer layer 12 was reactively sputtered at 100° C. onto the E-CTFE substrate 10', in an O₂-containing atmosphere, using an SiO₂ target, after which pure (99.990%) silicon was evaporated onto the SiO₂ layer 12 at room temperature in an electron beam-heated evaporator to the 0.5 μm thickness of a-Si layer 11'. Also, samples were made of the FIGS. 1 and 2 embodiments with sputtered silicon instead of evaporated silicon to form the amorphous silicon (a-Si) layers 11 and 11'.

Figure 3:
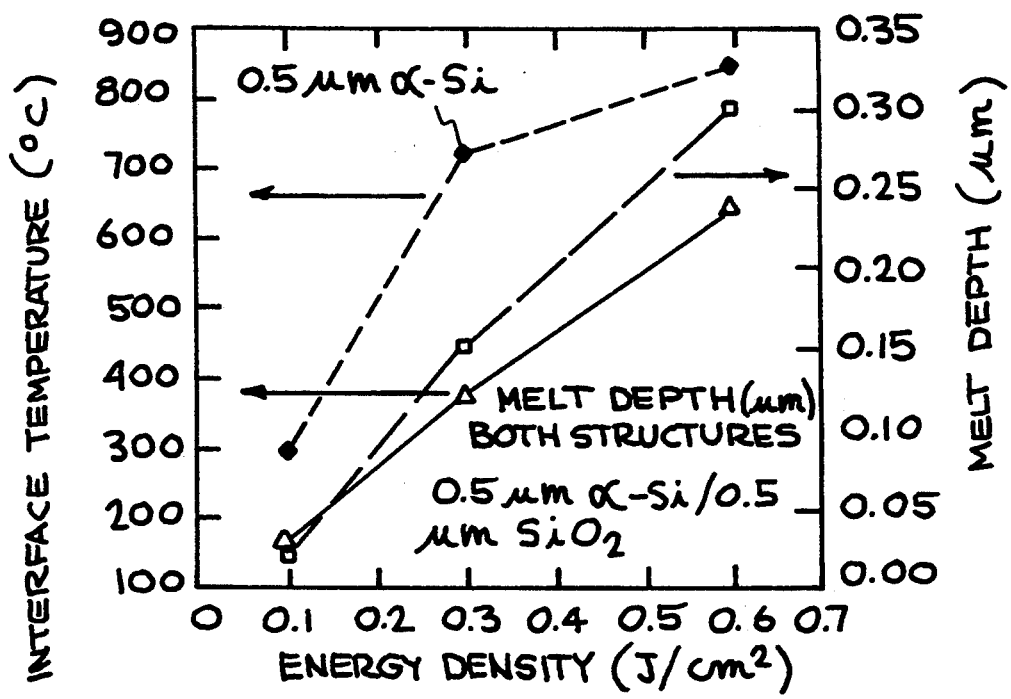
FIG. 3 is a graph illustrating maximum plastic temperature and melt depth vs. laser fluenced of structures of FIGS. 1 and 2.

Prior to experimental testing of samples of the FIGS. 1 and 2 embodiments, a simple thermal analysis was performed using the temperature-dependent and material-dependent thermal properties of the three materials (a-Si, SiO₂, and E-CTFF). A heat-flow simulator capable of two-dimensional analyses, was used in a one-dimensional mode to solve the heat diffusion equation:

$$\rho C \frac{\partial T}{\partial t} = P(z,t) + \frac{\partial}{\partial z}\left(k \frac{\partial T}{\partial z}\right)$$

where C, heat capacity, p, mass density, and k, thermal conductivity, depend on T, temperature, and the material at point z. The volumetric power density due to absorbed laser radiation and latent heat of phase changes is given in the term, P(z,t). FIG. 3, which illustrates maximum plastic temperature and melt depth vs. laser fluence, shows the results for numerical simulation of heat flow during the laser irradiation process. From FIG. 3 is seen the maximum temperature of the E-CTFE substrate and the maximum melt depth vs. laser energy density for samples, with and without the SiO₂ buffer layer of the embodiments of FIGS. 1 and 2. Note that the presence of the buffer layer significantly lowers the maximum E-CTFE temperature by approximately 50%, but does not affect the melt depth, since the heat pulse barely reaches the back of the amorphous silicon film by the time the maximum melt depth is attained.

In tests conducted to experimentally verify the present invention, samples of the FIG. 1 and FIG. 2 embodiments were exposed to pulsed laser radiation in three different environments, vacuum (<1 mT), 50 torr boron trifluoride (BF₃), and 50 torr phosphorous pentafluoride (PF₅) using an XeCl excimer laser producing 30 ns (FWHM) pulses of 308 nm light totaling approximately one joule per pulse, but with the energy density applied to the substrate being modulated by reflecting part of the energy away using beam-splitting optics. Beam intensity was spatially homogenized to ±3% derivation. These excimer laser pulses resulted in a change of the crystalline structure of a-Si layers 11 and 11' of the FIGS. 1 and 2 embodiments to produce polycrystalline and microcrystalline silicon (pc-Si) regions or junctions as indicated at 13 and 13'. Pulses were applied every five seconds for multi-pulse experiments. Energy applied to the substrate was measured for each sample using a Molectron Joule meter, and pulse-to-pulse stability of the energy was measured to be ±5%. The absolute accuracy of the Joule meter was calibrated by measuring the melt time of single-crystal silicon and referencing the corresponding fluence data, such as gathered by K. H. Weiner, Doctoral Thesis, Dept. of Electrical Engineering, Stanford University (1989).

Transmission electron micro-graphs (TEMs) were made from these samples, and micro-crystalline silicon was found. Some samples showed large grains extending from the surface into the material, with depth varying as a function of applied laser energy. For example, a compilation of these TEMs was made, show various variation conditions wherein: a low energy irradiation (170 mJ cm⁻²) yielded a relatively shallow (0.15 μm) microcrystalline region, a medium-energy irradiation (220 mJ cm⁻²) yielded a deeper (0.25 μm) crystallized region, and a high-energy irradiation (780 mJ cm⁻²) yielded a deeper (0.3 μm) crystallized region, but of a greater width than the width of the two lower-energy irradiated samples. A small area diffraction (SAD) of the above medium energy irradiated sample showed a definite silicon crystallite structure in the irradiated region. Prominent measured d-spacings were 0.307, 0.190, 0.162, 0.132, and 0.122 nm, resulting in a duration from the expected silicon d-spacings of 2%, which is well within the 4% accuracy of the SAD equipment utilized. Both of the above-exemplified low-energy and medium-energy irradiated samples consisted of 0.5 μm amorphous silicon deposited by evaporation directly on a 0.13 mm E-CTFE substrate, the FIG. 1 embodiment. The above-exemplified high-energy irradiated sample, which showed the largest crystallites found (approximately 0.3 μm deep by 0.1 μm wide) was made from sputtered amorphous silicon on an SiO₂ buffer layer on an E-CTFE substrate, the FIG. 2 embodiment. It was noted that the micro-crystalline region of the above-exemplified high-energy irradiated sample occupied the remainder of the a-Si film thickness, so that no amorphous silicon phase remained, and that the energy applied (780 mJ cm⁻²) on the sputtered a-Si on the SiO₂ layer (FIG. 2) was much higher than the energy used with the samples of evaporated silicon directly on the substrate (FIG. 1). Of the tests conducted, the highest non-ablating fluence was much higher for the sputtered amorphous silicon (800 mJ cm²) than for the evaporated amorphous silicon (250 mJ cm⁻²).

Figure 4:
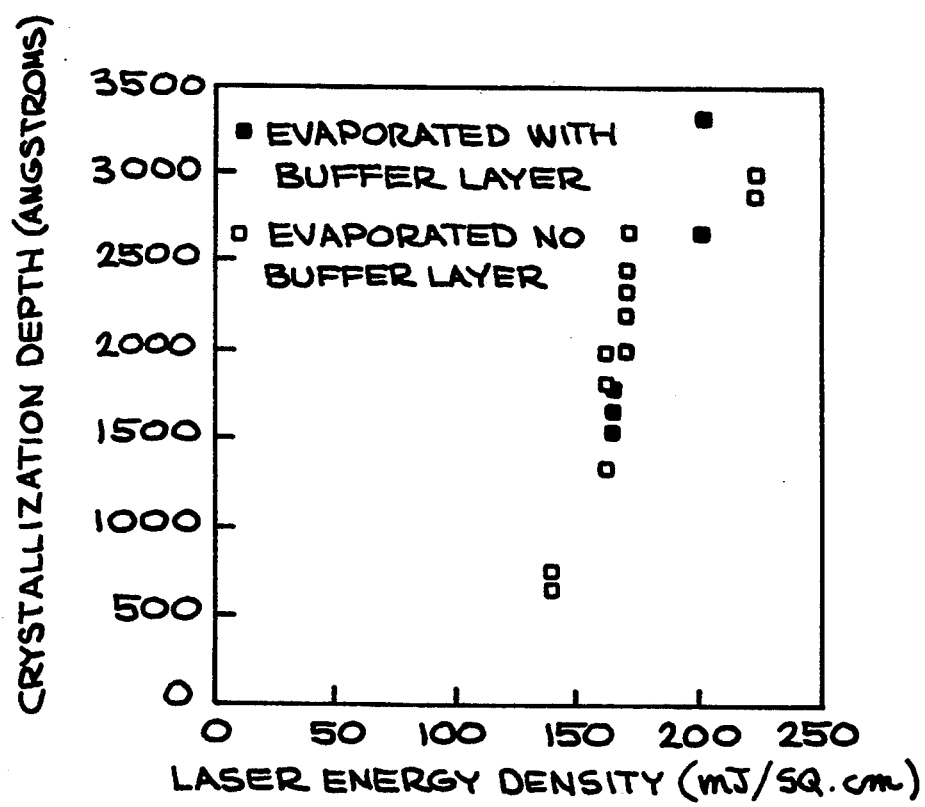
FIG. 4 is a graph illustrating a depth control plot showing both buffer and no-buffer samples of the FIGS. 2 and 1 embodiments.

Referring now to FIG. 4 which illustrates a compilation of test samples wherein the a-Si layer was deposited by evaporation on either the substrate directly or on the buffer layer, and shows the relationship of crystallization depth to laser fluence. FIG. 4 verifies the prediction obtained from FIG. 3, that the SiO₂ buffer or thermal barrier layer doesn't make any difference for these shallow depths, produced with relatively low laser fluences. However, in tests conducted on samples using higher laser fluence, such as 780 mJ cm⁻² described above, the buffer layer functioned as an effective thermal barrier for the low-temperature (E-CTFE) substrate, with the a-Si layer being deposited by sputtering or by evaporation.

Figure 5:
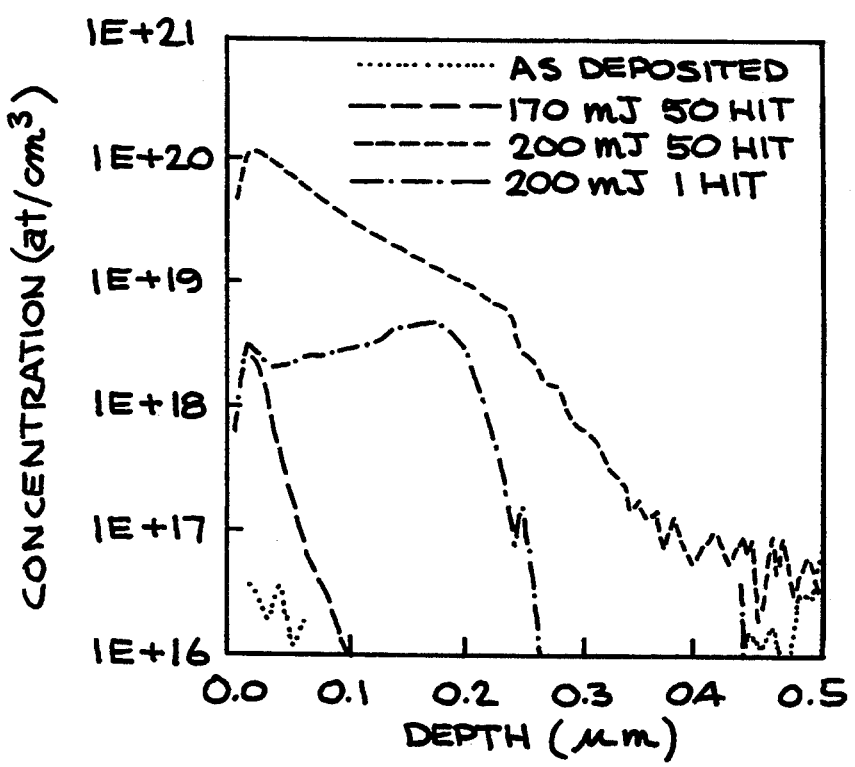
FIG. 5 is a graph illustrating SIMS dopant profiles concentration (at/cm$^3$)/depth ($\mu$m) for boron-doped samples of the buffer and no-buffer types.

As pointed out above, samples were irradiated in a vacuum as well as in doping atmospheres to produce either a boron or a phosphorous doped crystalline region or junction 13 and 13' of FIGS. 1 and 2. The samples irradiated in doping atmospheres were analyzed using secondary ion mass spectroscopy (SIMS), and the dopant profiles thus produced are summarized in FIG. 5, wherein the indicated energies (laser fluences) are per square centimeter. The presence of the buffer layer (FIG. 2) did not make any differences for these fluences. Both shallow and relatively deep junctions or regions (illustrated at 13 and 13' in FIGS. 1 and 2) are possible, and the number of pulses applied serve to shape the dopant concentration profile. No carbon diffusion into the substrate was found in any of the samples, although the carbon concentration was relatively high ($10^{17}$ cm$^{-3}$) in the as-deposited samples, as seen in FIG. 5. Dopant profiles produced using PLP of silicon thin films on E-CTFE substrates cannot be explained using conventional diffusion models, because after the first pulse, most of the micro-crystalline material no longer melts upon exposure to subsequent pulses. In addition, the total time the silicon layer is hot is very short, on the order of microseconds. Therefore, unusually fast dopant diffusion may be occurring in these samples, possibly due to diffusion along grain boundaries.

While the above-described test samples used E-CTFE as the low-temperature substrate, other low-temperature materials such as above-referenced polyethersulfone (PES) and ethylene-tetrafluoroethylene (E-TFE), as well as polyvinylidene fluoride (PVDF), poly-tetra-fluoro-ethylene (PTFE), fiberglass enhanced plastic (FEP), and high density poly-ethylene (HDPE), for example, may be utilized as the substrate. The buffer layer may also be made of titanium oxide ($TiO_2$), tantalum oxide ($TaO_2$), aluminum oxide ($Al_2O_3$), and magnesium oxide (MgO), as sol gels, aerogels and polymers. Also, pulsed high energy sources such as KrF excimer and ArF excimer lasers, e-beams, flashlamps, dye lasers, and YAG lasers may be utilized. Also, the a-Si and/or $SiO_2$ layers may be deposited by plasma enhanced chemical vapor deposition (PECVD).

Hydrogenization or other materials can be incorporated into the formed crystalline structure by introducing the appropriate gas (hydrogen, oxygen, etc.) into the chamber at the time the a-Si is exposed to laser radiation.

It has thus been shown that the present invention provides a method or process for the crystallization and doping of amorphous silicon on low-temperature plastic, with or without an intermediate buffer or thermal barrier layer. The invention thereby enables high energy materials processing on inexpensive, high strength, transparent commercial-grade plastics for the production of thin-film devices, such as electronic components.

While specific embodiments have been illustrated and described, and specific materials, temperatures, parameters, etc. have been described, such is not intended to limit the invention. Modifications and changes will become apparent to those skilled in the art, and it is intended for the scope of this invention to include such modifications and changes, and it is intended that the invention be limited only by the scope of the appended claims.

We claim:

1. A method for improving the crystallinity of a thin film of amorphous silicon directly deposited on a low temperature plastic substrate incapable of withstanding sustained processing temperatures higher than about 180° C. and sustained processing time periods longer than about $10^5$ nanoseconds, comprising the steps of:
   positioning the deposited thin film in a controlled atmosphere; and
   applying at least one pulse from a pulsed high energy source onto the thin film for a time period sufficient to change the crystallinity of the thin film without heating the substrate above a temperature of about 180° C. for more than about $10^5$ nanoseconds.

2. The method of claim 1, additionally including the step of forming the low-temperature plastic substrate from material selected from the group consisting of E-CTFE, E-TFE, PES, PVDF, PTFE, FEP and HDPE.

3. The method of claim 2, additionally including the steps of depositing a thin film of amorphous silicon on the low-temperature plastic substrate.

4. The method of claim 3, wherein the step of depositing the thin film is carried by a process selected from the group of evaporation, sputtering, electro-deposition, solvent-deposition, spin-on coating and PECVD.

5. The method of claim 2, additionally including the steps of depositing a layer of thermal barrier material on the low-temperature plastic substrate, and then depositing a thin film of amorphous silicon on the layer of thermal barrier material.

6. The method of claim 5, wherein the step of depositing the layer of thermal barrier material is carried out by depositing a layer of $SiO_2$ onto the low-temperature plastic substrate by a process selected from the group of sputtering, electro-deposition, solvent-deposition, spin-on coating and PECVD.

7. The method of claim 6, wherein the step of depositing the thin film of amorphous silicon is carried out by a technique selected from evaporation, electro-deposition, solvent-deposition, spin-on coating and sputtering.

8. The method of claim 6, wherein the layer of $SiO_2$ is deposited to a thickness of 0.5 $\mu$m, and wherein the thin film of amorphous silicon is deposited to a thickness of 0.5 $\mu$m.

9. The method of claim 8, wherein the low-temperature substrate is formed from 0.13 mm thick E-CTFE.

10. The method of claim 8, wherein said at least one pulse from a pulsed high energy source is provided by a pulsed ultra-violet laser producing 30 ns pulses of 308 nm light.

11. The method of claim 1, wherein the step of applying at least one pulse from a pulsed high energy source is provided from a group of high energy sources composed of XeCl, KrF and ArF excimer lasers, electron-beams, dye lasers, flashlamps, YAG lasers.

12. The method of claim 11, wherein the at least one pulse from a pulsed energy high energy source is provided by an XeCl excimer laser operating at energy levels of about 150 mJ cm$^{-2}$ to about 800 mJ cm$^{-2}$.

13. The method of claim 12, additionally including the step of providing the at least one pulse from the XeCl eximer laser for a time period of about 5 to 60 ns.

14. The method of claim 11, additionally including the step of providing the at least one pulse for a time period less than $10^5$ ns.

15. The method of claim 1, wherein the controlled atmosphere is provided by the step of selecting an environment from the group of air, hydrogen, oxygen, $BF_3$, $AsF_5$ and $PF_5$.

16. The method of claim 2, wherein the controlled atmosphere is provided by the step of selecting an environment from the group consisting of a vacuum at <1 mT, 50 torr $BF_3$, and 50 torr $PF_5$.

17. The method of claim 16, wherein the at least one pulse is provided by a XeCl excimer laser producing irradiation in the range of about 150 mJ cm$^{-2}$ to about 800 mJ cm$^{-2}$.

18. The method of claim 1, additionally including the step of providing the controlled atmosphere with a dopant selected from the group of BF3, and PF5 such that the changed crystallinity of the amorphous silicon is composed of polycrystalline or micro-crystalline silicon doped with boron or phosphorous.

19. The method of claim 17, wherein the XeCl excimer laser produced 30 ns (FFWHM) pulses of 308 nm light.

20. A process for producing at least one region of doped polycrystalline or micro-crystalline silicon in a thin film of amorphous silicon deposited on a substrate composed of commercial-grade plastic incapable of withstanding processing; temperatures of higher than 180° C. for longer than about 35 nanoseconds, comprising the steps of:

forming the substrate from material selected from the group of E-CTFE, E-TFE, PES, PVDF, PTFE, FEP, and HDPE;

depositing a thin film of amorphous silicon on the substrate;

positioning the thus formed structure in a controlled environment selected from the group of vacuum (<1 mT), 50 torr $BF_3$, and 50 torr $PF_5$; and directing at least one pulse of 308 nm light from a XeCl laser onto the thin film of amorphous silicon for providing irradiation energy in the range of about 150 mJ $cm^{-2}$ to about 800 mJ $cm^{-2}$.

21. The process of claim 20, wherein a pulse of 308 nm light is provided for a time period of 5 to 60 nanoseconds.

22. The process of claim 21, additionally including the step of depositing a buffer layer of $SiO_2$ on the substrate prior to depositing the thin film of amorphous silicon.

23. The process of claim 21, wherein the formed structure is produced from 0.13 mm thick E-CTFE, and 0.5 $\mu$m thick amorphous silicon.

24. The process of claim 23, wherein the formed structure is produced to include a 0.5 $\mu$m thick layer of $SiO_2$ between the substrate and the amorphous silicon.

* * * * *